United States Patent [19]
Ferling et al.

[11] Patent Number: 6,157,544
[45] Date of Patent: Dec. 5, 2000

[54] ELECTRICAL CIRCUIT CONFIGURATION ARRANGED IN A CASING

[75] Inventors: Dieter Ferling, Stuttgart; Fred Buchali, Waiblingen, both of Germany

[73] Assignee: Alcatel, Paris, France

[21] Appl. No.: 09/113,230

[22] Filed: Jul. 10, 1998

[30] Foreign Application Priority Data

Jul. 11, 1997 [DE] Germany .......................... 197 29 671

[51] Int. Cl.$^7$ ...................................................... H05K 9/00
[52] U.S. Cl. .......................... 361/800; 361/816; 361/517; 361/799
[58] Field of Search .................................... 361/800, 816, 361/517, 424, 393, 799

[56] References Cited

U.S. PATENT DOCUMENTS

| | | | |
|---|---|---|---|
| 5,392,197 | 2/1995 | Cuntz et al. | 361/818 |
| 5,401,688 | 3/1995 | Yamaji et al. | 437/209 |
| 5,438,333 | 8/1995 | Perkins et al. | 342/4 |
| 5,500,789 | 3/1996 | Miller et al. | 361/816 |
| 5,729,441 | 3/1998 | Murakami | 361/818 |

FOREIGN PATENT DOCUMENTS

| | | |
|---|---|---|
| 0402970 | 12/1990 | European Pat. Off. . |
| 0612118 | 8/1994 | European Pat. Off. . |
| 8813683 | 4/1989 | Germany . |
| 3936494 | 5/1990 | Germany . |
| 29621804 | 4/1997 | Germany . |

OTHER PUBLICATIONS

Patent Abstract of Japan, vol. 7, No. 154 (E–185) Jul. 6, 1983 & JP 58 063201 A (Matsushita Denki Sangyo KK) Apr. 15, 1983.

Patent Abstract of Japan, vol. 14, No. 16 (E–872) Jan. 12, 1990 & JP 01 158496 A (Kawasaki Heavy Ind. Ltd), Oct. 16, 1989.

Patent Abstract of Japan, vol. 7, No. 76 (E–167), Mar. 30, 1983 & JP 58 006142 A (Sanyo Denki KK), Jan. 13, 1983.

Patent Abstract of Japan, vol. 6, No. 247 (E–146) Dec. 7, 1982 & JP 57 147301 A (Mitsubishi Denki KK), Sep. 11, 1982.

Patent Abstract of Japan, vol. 13, No. 243 (E–768) Jun. 7, 1989 & JP 01 044097 A (Denki Kaguku Kogyo KK), Feb. 16, 1989.

*Primary Examiner*—Leo P. Picard
*Assistant Examiner*—Hung Van Duong
*Attorney, Agent, or Firm*—Ware, Fressola, Van der Sluys & Adolphson LLP

[57] ABSTRACT

To protect the high frequency circuits arranged in a casing and which are operated at frequencies of >1 GHz to 100 GHz against inner electromagnetic perturbing radiation, the complete circuit (1) is equipped on both sides with a large area layer (3, 4) which absorbs electrical fluctuations. The layer (4), made from a material which absorbs electrical fluctuations, such as silicon with average conductivity, is arranged below the circuit carrier (1). The circuit carrier (1) with the components (5) is encapsulated by a dielectric material such as silicon sealing compound or epoxy resin. The layer (3) made from a sealing compound which absorbs electrical fluctuations, such as silicon filled with iron powder, is arranged above the encapsulated circuit carrier (1, 2).

8 Claims, 1 Drawing Sheet

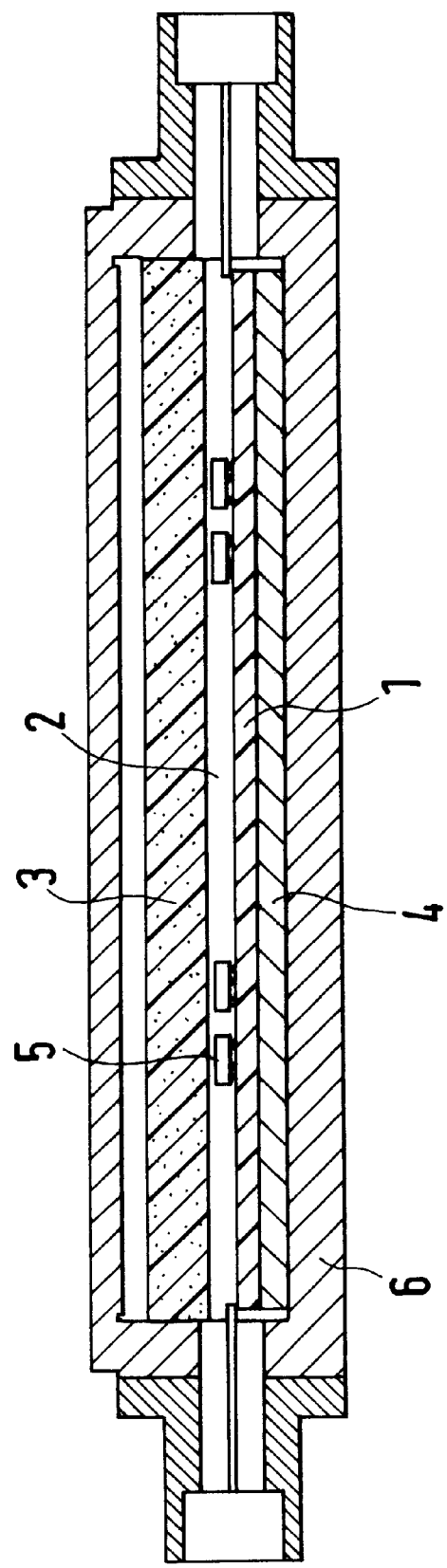

ELECTRICAL CIRCUIT CONFIGURATION ARRANGED IN A CASING

TECHNICAL FIELD

The application refers to a casing containing an electrical circuit configuration consisting of a circuit carrier with components arranged on it.

BACKGROUND OF THE INVENTION

When the circuit configuration works at frequencies over 1 GHz or even over 100 GHz, there is a risk that unwelcome inner electromagnetic waves are created which can adversely affect the reliable function of adjacent circuit parts. In order to prevent these disadvantageous mutual adverse effects in adjacent circuit states, these are arranged separate from each other in smaller casings. Although this measure means that the adjacent circuit stages are effectively shielded from one another, it is also connected with a not insignificant expense. Additional smaller casings are arranged within the metal casing holding the whole circuit configuration; these smaller casings lead not only to additional costs but also an increased spatial requirement. In addition, this technology requires a larger number of signal transitions and connection points.

SUMMARY OF THE INVENTION

The technical problem on which the invention is based therefore consists of designing the arrangement of an electrical circuit configuration with its casing in such a way that the individual shielding of a number of stages is superfluous.

This technical problem is solved by the invention in that the circuit carrier is provided on at least one side with a layer with a large area which absorbs electromagnetic waves. This measure means the prevention of the creation of cavity effects in the casing and the dissemination of parasitic waves into the circuit which can lead to faults in the circuit function. In addition, the necessary input required for components and space is lower.

BRIEF DESCRIPTION OF THE DRAWING

Advantageous details of the invention can be found and which are explained using an embodiment shown in the diagram.

The drawing is a cross-sectional view of the circuit arrangement according to the present invention.

BEST MODE FOR CARRYING OUT THE INVENTION

In the diagram, the casing 6 with the circuit carrier 1 arranged in it can be seen, on which for example a number of components 5 are arranged. The circuit carrier 1 is encapsulated using a dielectric material, for example a silicon sealing compound or an epoxy resin, which forms the layer 2. Above the encapsulated circuit carrier 1, layer 3 is arranged, made from a material which absorbs electromagnetic waves such as silicon or epoxy resin filled with iron powder or carbon. Below the circuit carrier 1, an additional layer 4 can be arranged, made from a material which absorbs electromagnetic waves such as silicon of average conductivity. The conductivity of this layer would, for example, be approx. 3 Ωcm.

What is claimed is:

1. A circuit arrangement for minimizing the effects of operating circuit components at high frequencies, comprising:
    a) a circuit carrier (1) dimensioned for receipt of components (5) positioned thereon;
    b) a first large area layer (3) positioned above the components in juxtaposed spaced relationship to the circuit carrier (1) for absorbing high frequency electromagnetic waves generated by one or more of the components positioned on the circuit carrier;
    c) a second large area layer (4) positioned below the circuit carrier (1) for absorbing high frequency electromagnetic waves generated by any of the components; and
    d) a casing (6) positioned around the first large area layer and second large area layer for encapsulating said layers and the circuit carrier and components positioned thereon;
    wherein the first layer is made from a material which absorbs high frequency electromagnetic waves such as silicon or epoxy resin filled with iron powder or carbon and further wherein the second large area layer is made from a material which absorbs high frequency electromagnetic waves such as silicon of average conductivity.

2. A circuit arrangement as defined in claim 1, wherein the second large area layer has an average conductivity of 3 ohms per centimeter.

3. A circuit arrangement as defined in claim 2, further comprising a sealing layer (2) formed from a dielectric material which encapsulates the components (5) positioned on the circuit carrier (1).

4. A circuit arrangement as defined in claim 3, wherein the encapsulating dielectric material which forms the sealing layer (2) is made from a silicon sealing compound or an epoxy resin.

5. A circuit arrangement as defined in claim 4, wherein the first and second large area layers absorb high frequency electromagnetic waves generated by any of the components in the frequency range of approximately 1 gigahertz to approximately 100 gigahertz.

6. A circuit arrangement as defined in claim 1, further comprising a sealing layer (2) formed from a dielectric material which encapsulates the components (5) positioned on the circuit carrier (1).

7. A circuit arrangement as defined in claim 6, wherein the encapsulating dielectric material which forms the sealing layer (2) is made from a silicon sealing compound or an epoxy resin.

8. A circuit arrangement as defined in claim 7, wherein the first and second large area layers absorb high frequency electromagnetic waves generated by any of the components in the frequency range of approximately 1 gigahertz to approximately 100 gigahertz.

* * * * *